United States Patent
Liu et al.

(10) Patent No.: US 11,094,473 B2
(45) Date of Patent: Aug. 17, 2021

(54) ALL-DAY SOLAR CELL SYSTEM INTEGRATING HIGH CAPACITY PHOTOCHROMIC STORAGE AND DISCHARGE

(71) Applicant: University of Massachusetts, Boston, MA (US)

(72) Inventors: Fuqiang Liu, Acton, MA (US); Zi Wei, Lowell, MA (US); Husain Almakrami, Lowell, MA (US)

(73) Assignee: University of Massachusetts, Boston, MA (US)

( * ) Notice: Subject to any disclaimer, the term of this patent is extended or adjusted under 35 U.S.C. 154(b) by 0 days.

(21) Appl. No.: 16/344,007

(22) PCT Filed: Oct. 24, 2017

(86) PCT No.: PCT/US2017/058085
§ 371 (c)(1),
(2) Date: Apr. 22, 2019

(87) PCT Pub. No.: WO2018/081120
PCT Pub. Date: May 3, 2018

(65) Prior Publication Data
US 2019/0341198 A1 Nov. 7, 2019

Related U.S. Application Data

(60) Provisional application No. 62/412,081, filed on Oct. 24, 2016.

(51) Int. Cl.
*H01G 9/20* (2006.01)

(52) U.S. Cl.
CPC ......... *H01G 9/2027* (2013.01); *H01G 9/2018* (2013.01); *H01G 9/2036* (2013.01); *H01G 9/2059* (2013.01)

(58) Field of Classification Search
CPC .. H01G 9/2027; H01G 9/2018; H01G 9/2036; H01G 9/2059
See application file for complete search history.

(56) References Cited

U.S. PATENT DOCUMENTS

| | | | | |
|---|---|---|---|---|
| 2004/0163700 A1* | 8/2004 | Mizuta | ............... | H01G 9/2013 136/263 |
| 2005/0236036 A1* | 10/2005 | Ohtaka | ............... | H01L 51/0064 136/263 |
| 2007/0079870 A1* | 4/2007 | Park | ............... | H01G 9/2027 136/263 |
| 2009/0000658 A1* | 1/2009 | Zakeeruddin | ............... | B82Y 10/00 136/252 |

(Continued)

OTHER PUBLICATIONS

Liu et al., Reversible Electron Storage in an All-Vanadium Photoelectrochemical Storage Cell: Synergy Between Vanadium Redox and Hybrid Photocatalyst, American Chemical Society, Catalysis, Vo./Issue 5, pp. 2632-2639 (Year: 2015).*

(Continued)

*Primary Examiner* — Jayne L Mershon
(74) *Attorney, Agent, or Firm* — Milstein Zhang & Wu LLC

(57) ABSTRACT

The invention provides an all-day solar cell system that is capable of simultaneously generating and storing electricity, which allows efficient photocharge during the day and discharge at night.

6 Claims, 8 Drawing Sheets

A

B

(56) References Cited

U.S. PATENT DOCUMENTS

| | | | | |
|---|---|---|---|---|
| 2012/0267234 A1* | 10/2012 | Reece | ................... | C01B 3/042 |
| | | | | 204/157.5 |
| 2014/0020745 A1* | 1/2014 | Hupp | ................... | H01G 9/2031 |
| | | | | 136/256 |
| 2016/0071655 A1* | 3/2016 | Li | ................... | H01L 31/1888 |
| | | | | 136/254 |
| 2017/0133162 A1* | 5/2017 | Jones | ................... | H01G 9/2018 |

OTHER PUBLICATIONS

Shalini et al., Status and outlook of sensitizers/dyes used in dye sensitized solar cells (DSSC): a review, International Journal of Energy REsearch, vol./Issue 40, pp. 1303-1320 (Year: 2016).*

Liu et al., All-vanadium redox photoelectrochemical cell: An approach to store solar energy, Electrochemistry Communications, vol./Issue 45, pp. 79-82 (Year: 2014).*

* cited by examiner

A                                                  B

A

B

A

B

ALL-DAY SOLAR CELL SYSTEM INTEGRATING HIGH CAPACITY PHOTOCHROMIC STORAGE AND DISCHARGE

PRIORITY CLAIMS AND RELATED PATENT APPLICATIONS

This application is the U.S. national phase of and claims priority to PCT/US17/58085, filed Oct. 24, 2017, which claims the benefit of priority to U.S. Provisional Application Ser. No. 62/412,081, filed on Oct. 24, 2016, the entire content of each of which is incorporated herein by reference.

STATEMENT REGARDING FEDERALLY FUNDED RESEARCH OR DEVELOPMENT

This invention was made with government support under Grant No. 1739137 by awarded by the US National Science Foundation. The Government has certain rights in the invention.

TECHNICAL FIELDS OF THE INVENTION

The invention generally relates to solar cell and renewable energy systems. More particularly, the invention relates to an all-day solar cell system that is capable of simultaneously generating and storing electricity, which allows efficient photocharge during the day and discharge at night.

BACKGROUND OF THE INVENTION

A growing number of countries and regions have installed significant solar power capacity into their grids to supplement or provide an alternative to conventional energy sources and to reduce dependence on fossil fuels. (Renewables 2016 Global Status Report, ISBN 978-3-9818107-0-7; IEA: Global Installed PV Capacity Leaps to 303 Gigawatts, Greentechmedia, Eric Wesoff, Apr. 27, 2017.) At the same time, there is a growing need for improved solar energy storage capacities, in particular those that provide an effective solution to the inherent intermittency and fluctuating levels of power consumption and generation on the electric grid.

Improved integration of solar cells and energy storage can substantially improve reliability, availability, and quality of the renewable energy source. The current approach to externally couple rechargeable batteries with PV systems leads to fragile and expensive solar cell systems. Instead, internal integration of storage capability directly into solar cells is more attractive for higher efficiency and reliability. To achieve this object, much effort is directed to simple miniaturization of two devices in combination: a solar cell and a capacitor or battery, each of which consists of multiple components. In such a set up, fabrication and control of electric current switching are complicated and can increase both system risks and operation cost.

Effective solar power storage solutions are becoming increasingly acute due to multiple factors, including: the desire to increase the use of intermittent solar energy, the demand for improved power quality and reliability due to increasing use of renewable energy, the continuous growth in electrical power consumption, the growing possibility of disruptions to the electric grid, and the desire to maximize the use of distributed generation assets.

Therefore, there remains an urgent need for novel technological solutions that provide solar energy generation and storage with significantly improved efficiency, storage capacity, reliability, and scale-up capability.

SUMMARY OF THE INVENTION

The invention is based in part on the discovery of an un-conventional all-day solar cell system (ADSC) that simultaneously generates and stores electricity. The competitive advantage of the disclosed system includes its unique capability to integrate electrical energy storage at the point of solar energy generation and discharge at night or under reduced light intensity, making the all-day solar power feasible. The disclosed system is characterized by high efficiency of electricity generation, fast charge/discharge kinetics and cycle reversibility, improved storage capacity, robust stability and reliability, and is suitable scale-up production.

In one aspect, the invention generally relates to a solar cell system, which includes: a dye-sensitized photochromic semiconductor (SC) adapted to serve as a photoelectrode (PE) and a negative electrode (−); a positive electrode (+); and an aqueous environment comprising a dissolved redox shuttle pair Ox/Re.

In another aspect, the invention generally relates to an article of manufacture comprising the solar cell system disclosed herein.

In yet another aspect, the invention generally relates to a method for fabricating a solar cell. The method includes: providing a photochromic semiconductor (SC); depositing a dye to the photochromic semiconductor; providing a positive electrode (+); positioning the dye-deposited photochromic semiconductor in reference to the positive electrode (+) so as to serve as a negative electrode (−) and a photoelectrode (PE); and providing an aqueous environment comprising a dissolved redox shuttle pair Ox/Re to form a solar cell In yet another aspect, the invention generally relates to a solar cell produced by a method disclosed herein or an article of manufacture having such a solar cell.

BRIEF DESCRIPTION OF THE DRAWINGS

In FIG. 1b and FIG. 1c, the red and blue arrows indicate charge transfer processes and redox reactions, respectively. The thickness of the arrows denotes the relative rates of the charge transfer/reaction processes. HOMO and LUMO in (FIG. 1b) refer to highest occupied molecular orbital and lowest unoccupied molecular orbital of the dye, respectively.

(FIG. 4A, left)×2,000 and (FIG. 4B, right)×100,000.

(FIG. 8A, top) Short-circuit photocurrents under AM1.5 for the ADSCs using 0.1M vanadium redox couple ($V^{4+}$) at different concentrations of the $H_2SO_4$ supporting electrolyte. (FIG. 8B, bottom) Short-circuit discharge current under dark for the ADSCs using 0.01M vanadium redox couple ($V^{4+}$) at different concentrations of the $H_2SO_4$ supporting electrolyte.

(FIG. 11A, top) $WO_3$-based hybrid photoelectrode showing the electrode surface and individual particle of $TiO_2$ with decorated $WO_3$ islands; (FIG. 11B, bottom) short-circuit discharge currents under dark for a $TiO_2$—$WO_3$ hybrid electrode. The photoelectrode was sensitized with N-719 dye. The electrolyte was 0.01 M vanadium ($V^{4+}$) balanced with 0.1M $H_2SO_4$.

DETAILED DESCRIPTION OF THE INVENTION

The invention provides a high-capacity electricity generation and storage system with an integrated solar cell that undergoes reversible photochromic switching, a redox process, allowing for efficient photocharge during the day and a multi-hour long discharge at night. The ADSC system allows multiple hours of electricity generation, use and simultaneous storage followed by multiple hours of discharge.

The disclosed invention circumvents the problems associated with the state-of-the-art solar energy storage systems centers on a high-capacity photochromic electrode in a dye-sensitized solar cell construction, which results in a robust, multi-functional, low-cost, and efficient device.

For example, the disclosed invention improves over the recently reported all-vanadium photoelectrochemical (PEC) cell, which resembles a solar-powered redox flow battery. (Liu, et al. *Electrochimica Acta*, 136, (2014): 435-41; Liu, e al. *ACS Catalysis*, 5, no. 4 (2015): 2632-39.) In that system, the photochromic property of $WO_3$ and the reversible charge and discharge of photoinduced electrons in a hybrid $WO_3$/$TiO_2$ photoelectrode were utilized.

The present invention features a more advantageous device and a different approach, i.e., the integration of dye-sensitization and high-capacity photochromic materials in an ADSC. This novel construct allows for a low-cost solar cell with built-in energy storage capability while capable of providing all-day power supply.

Figure 1:
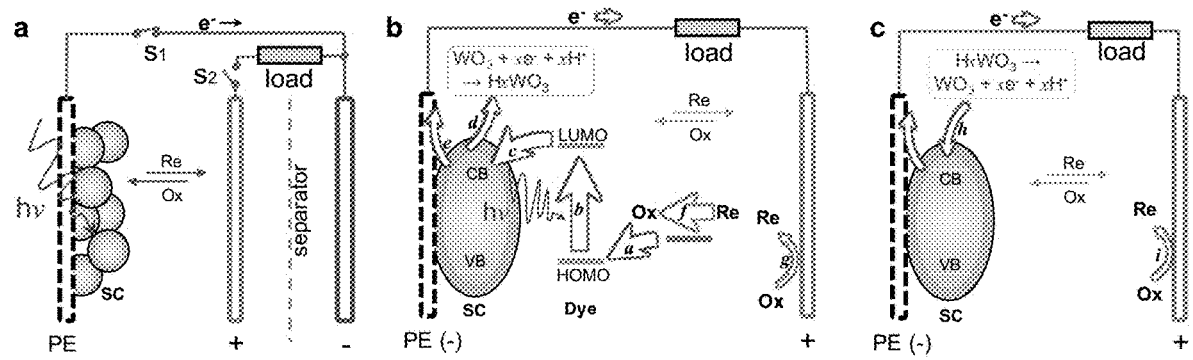
FIG. 1. Schematic comparison between (FIG. 1a) a conventional solar storage device and the disclosed unconventional ADSC system (FIG. 1b) in Light Mode and (FIG. 1c) Dark Mode.

A schematic illustration is provided in FIG. 1 comparing between the conventional solar storage device (FIG. 1a) and the disclosed unconventional ADSC system in the light mode (FIG. 1b) and (c) the dark mode (FIG. 1b).

As shown in FIG. 1a, to directly integrate storage capability into solar cells, the conventional approach is to simply add a solar power component to a typical storage device, such as a battery, supercapacitor, thermoelectric generator, $H_2$ fuel cell, etc. To accommodate this combination, smart load switch controllers (S1 and S2 in FIG. 1a) must be employed in the cell module to allow photocharge and discharge under different conditions (light and dark). This approach, however, are accompanied by major disadvantages and limitations, for example, high fabrication cost, increased complexity in system operation, slow and delayed response to dynamic shift of demand, and poor efficiency.

The ADSC system of the invention, in contrast, integrates a dye-sensitized photoelectrode (PE) and negative electrode (−) into a single component, i.e., dye-sensitized photochromic semiconductor (SC). In light mode, as illustrated in FIG. 1b, the photogenerated electrons from the dye are injected to the conduction band (CB) of an exemplary SC of $WO_3$ (c). Part of the electrons contribute to the photocurrent (e) and the rest will be stored within the photochromic SC (d). The electrons are stored in the form of $H_xWO_3$ (c), as a result of the photochromic reaction: $WO_3 + xe^- + xH^+ \rightarrow H_xWO_3$. Redox reactions of a dissolved redox shuttle pair Ox/Re with the positive electrode (+) (g) and the dye molecules (f) help to complete the circuit.

FIG. 1b shows that the output voltage of the ADSC is determined by the energy difference between the redox shuttle potential and the quasi-Fermi level of the photochromic SC material. To achieve an optimum power for the device, the desired redox shuttle must have redox potential close to the HOMO energy of the dye, but has to be reactive enough to allow efficient charge transfer between the dye molecules (process a, FIG. 1b). Suitable materials include that are widely available $WO_3$ and Ru-based dye.

The reverse reaction (h), occurring in the dark mode as illustrated in FIG. 1c, releases the stored electrons and continues the electric current. Discharge of the photochromic SC (h) continues the electric current, while reduction of the redox shuttle (i) occurs at the (+) electrode. The discharge voltage is determined by the energy difference between the Ox/Re redox potential and the quasi-Fermi level of electrons in the SC electrode (close to its CB edge).

In one aspect, the invention generally relates to a solar cell system, which includes: a dye-sensitized photochromic semiconductor (SC) adapted to serve as a photoelectrode (PE) and a negative electrode (−); a positive electrode (+); and an aqueous environment comprising a dissolved redox shuttle pair Ox/Re.

In certain embodiments of the solar cell system, the dye-sensitized photochromic semiconductor includes a dye molecule having a light absorption band in the range from about 380 nm to about 750 nm (e.g., from about 420 nm to about 750 nm, from about 450 nm to about 750 nm, from about 520 nm to about 750 nm, from about 600 nm to about 750 nm, from about 380 nm to about 650 nm, from about 380 nm to about 550 nm, from about 380 nm to about 450 nm), and a photochromic semiconductor.

Any suitable photochromic semiconductor materials may be used, for example, one or more selected from the group consisting of $WO_3$, $MoO_3$, hexacyanoferrates, Prussian blue, conjugated conducting polymers, viologens, and other metal oxides and complexes.

In certain embodiments of the solar cell system, the photochromic semiconductor is $WO_3$. In certain embodiments of the solar cell system, the photochromic semiconductor comprises $TiO_2$—$WO_3$ hybrid electrodes.

In certain embodiments of the solar cell system, the photochromic semiconductor is $TiCl_4$-treated, where the photochromic semiconductor comprises nanoparticles of $WO_3$ fused together by the $TiCl_4$ treatment and a high-temperature sintering process.

In certain embodiments of the solar cell system, the photochromic semiconductor is partially or completed coated with a layer of a fluoropolymer, for example, Nafion (sulfonated tetrafluoroethylene based fluoropolymer-copolymer) or other ion-conducting polymers such as sulfonated polysulfone.

Any suitable dyes may be used, for example, those characterized by a light absorption band in the range from about 380 nm to about 750 nm (e.g., from about 420 nm to about 750 nm, from about 450 nm to about 750 nm, from about 520 nm to about 750 nm, from about 600 nm to about 750 nm, from about 380 nm to about 650 nm, from about 380 nm to about 550 nm, from about 380 nm to about 450 nm). Exemplary dyes include Ru-polypyridyl-complex dyes, such as N719 and N3 dyes, and metal-free organic dyes including indolic dyes, coumarin-based dyes, triarylamines, carbazoles, fluorenes, thiophenes and oligothiophenes.

In certain embodiments of the solar cell system, the dye is a Ruthenium dye, for example, N-719 dye having the structural formula of:

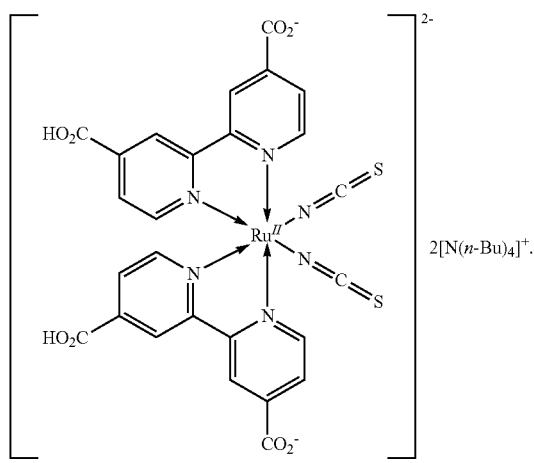

Any suitable redox couple may be employed, for example, one selected from the group consisting of Vanadium, Ferrocene, benzoquinone, iron, anthraquinone, ferrocyanide, and others that are commonly used in redox flow batteries.

In certain embodiments of the solar cell system, the redox couple Ox/Re is Vanadium ($V^{4+}/V^{5+}$) in a supporting electrolyte comprising $H_2SO_4$.

In certain embodiments, the solar cell system allows multiple hours, for example, from about 1 to about 12 hours (e.g., from about 1 to about 10 hours, from about 1 to about 8 hours, from about 1 to about 6 hours, from about 1 to about 4 hours, from about 2 to about 12 hours, from about 4 to about 12 hours, from about 6 to about 12 hours, from about 8 to about 12 hours) of electricity generation, use and simultaneous storage followed by multiple hours, for example, from about 1 to about 12 hours (e.g., from about 1 to about 10 hours, from about 1 to about 8 hours, from about 1 to about 6 hours, from about 1 to about 4 hours, from about 2 to about 12 hours, from about 4 to about 12 hours, from about 6 to about 12 hours, from about 8 to about 12 hours) of discharge.

In certain embodiments, the solar cell system provides a photocurrent in the light mode in the range of about 0.05 A to about 200 A (e.g., about 0.1 A to about 200 A, about 1 A to about 200 A, about 5 A to about 200 A, about 10 A to about 200 A, about 50 A to about 200 A, about 0.05 A to about 100 A, about 0.05 A to about 10 A, about 0.05 A to about 5 A, about 0.05 A to about 1 A, about 0.05 A to about 0.5 A) and a current in the dark mode in the range of about 0.01 A to about 200 A (e.g., about 0.05 A to about 200 A, about 0.1 A to about 200 A, about 1 A to about 200 A, about 10 A to about 200 A, about 20 A to about 200 A, about 100 A to about 200 A, about 0.01 A to about 100 A, about 0.01 A to about 10 A, about 0.01 A to about 5 A, about 0.01 A to about 1 A, about 0.01 A to about 0.5 A, about 0.01 A to about 0.1 A).

In another aspect, the invention generally relates to an article of manufacture comprising the solar cell system disclosed herein.

In yet another aspect, the invention generally relates to a method for fabricating a solar cell. The method includes: providing a photochromic semiconductor (SC); depositing a dye to the photochromic semiconductor; providing a positive electrode (+); positioning the dye-deposited photochromic semiconductor in reference to the positive electrode (+) so as to serve as a negative electrode (−) and a photoelectrode (PE); and providing an aqueous environment comprising a dissolved redox shuttle pair Ox/Re to form a solar cell In certain embodiments, the method further includes, prior to depositing a dye to the photochromic semiconductor, treating the photochromic semiconductor (SC) with $TiCl_4$ and a high-temperature sintering process.

In certain embodiments, the method further includes, following depositing a dye to the photochromic semiconductor, coating the dye-deposited photochromic semiconductor with a fluoropolymer.

Exemplary dyes include Ru-polypyridyl-complex dyes, such as N719 and N3 dyes, and metal-free organic dyes including indolic dyes, coumarin-based dyes, triarylamines, carbazoles, fluorenes, thiophenes and oligothiophenes.

Any suitable redox couple may be employed in the method, for example, one selected from the group consisting of Vanadium, Ferrocene, benzoquinone, iron, anthraquinone, ferrocyanide, and others that are commonly used in redox flow batteries. In certain embodiments of the method, the redox couple Ox/Re is Vanadium in a supporting electrolyte comprising $H_2SO_4$.

In yet another aspect, the invention generally relates to a solar cell produced by a method disclosed herein or an article of manufacture having such a solar cell.

The solar cell system disclosed herein offers unique benefits. The simplified system design allows for low fabrication and maintenance costs, unlike the conventional electrochemical solar devices where specially fabricated dual electrodes and organic solvents are required. The ADSC system is readily scalable and adopted because of its modular panel design that is compatible with the existing PV infrastructure.

The disclosed system also offers operational simplicity and low maintenance. As illustrated in FIG. 1c, the discharge current in the dark mode remains the same as the photocurrent in the light mode, obviating the need for smart switch controllers and dramatically simplifying the operation. At night or under reduced light intensity (e.g., cloudy or rainy conditions), the electron discharge automatically kicks in, providing an instantly responsive and effective energy management solution such as load leveling.

Additionally, the system of the invention employs high-capacity and earth-abundant photochromic materials such as $WO_3$ or $MoO_3$ in an aqueous solution. $WO_3$, for example, as a typical negative electrode material in Li-ion batteries, has capacity 4-times higher than that of state-of-the-art positive counterparts. Another feature is that a much thicker electrode (e.g., $LiCoO_2$) can be used leading to a much higher storage capacity, which is partially enabled by the chosen electrochemically active redox shuttle that could react through the entire thickness of the PE. The system enjoys a highly efficient DSSC platform with achievable efficiencies in the range of 6% to 19%.

The disclosed system also offers easy state-of-charge (SoC) monitoring. Precise SoC monitoring is important for energy storage devices. A major virtue of the disclosed invention is that the photochromic material undergoes distinct color change upon photocharge, providing a unique and readily discernable SoC monitoring mechanism.

Furthermore, the unique energy storage mechanism enables a wide range of capabilities. In the light mode (FIG. 1b), the photochromic reaction (d) at the PE is accompanied by Ox/Re redox reactions; however, the reaction rate from Re to Ox (f) is not balanced by its reverse reaction (g) at the (+) electrode (the thickness of the arrows in FIG. 1 denotes the relative rates of charge transfer/reaction processes), resulting in a monotonic rise of the Ox/Re ratio in the solution. This temporary unbalance is annulled by the continued reduction reaction (i) at the (+) electrode in the dark mode. This unique storage mechanism indicates that both the photochromic material and redox shuttle pair, as the storage agents, can be separately optimized without compromising the overall performance.

An important and immediate impact of the disclosed ADSC system is that it significantly increases the utility and value of non-dispatchable solar energy. The ADSC system enables both overall effectiveness and efficiency of energy load management and shorter term bridging power. In particular, addressing daily variations (e.g., mismatches between the time of day when renewable resources produce peak output and peak demand on the grid) requires multiple-hour run time capability, for which there are fewer technology options. The ADSC disclosed here can effectively address the surging need for daily renewable energy supply with the growing market share of solar energy. This will also minimize the need to build and operate spinning-reserve power plants, which is the most common method employed today to close the gaps between power consumption and generation.

The ADSC system also allows exploration of new sustainable energy product solutions, especially small-scale end users who rely on distributed generation—such as homes, schools, hospitals, and corporate office headquarters.

EXAMPLES

Summarized below are certain experiments on materials fabrication, photoelectrode optimization, cell assembly, tests of different combination of materials and redox couples, and evaluation of electric currents under both dark and simulated light, and analysis of storage capacity under dark.

In an exemplary embodiment, an ADSC system was built using vanadium redox species ($V^{4+}$) in 0.1 M $H_2SO_4$ as the supporting electrolyte, and nano-sized $WO_3$ loaded with N-719 dye and $TiCl_4$-treated photoelectrode. A photocurrent as high as 1.0 mA was observed and about 1 hour discharge under dark was achieved at around 0.25 mA in a laboratory-scale experimental cell.

The photoelectrode is the key component of the ADSC and its durability and performance are essential to the viability of the ADSC system. In an exemplary fabrication procedure, the following steps are included: mixing storage materials (e.g., $WO_3$ particles) with polyethylene glycol (PEG) and solvents, coating on a FTO glass, and then sintering at low- and high-temperatures.

Figure 2:
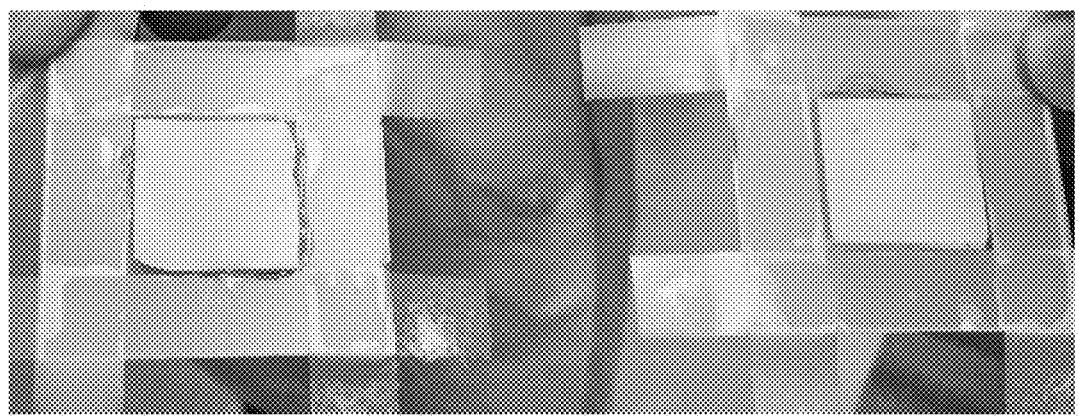
FIG. 2. Fabricated $WO_3$-based photoelectrodes with (FIG. 2A, right) and without (FIG. 2B, left) $TiCl_4$ treatment. $TiCl_4$ treatment has been widely utilized in literature and it was discovered in this work that applying $TiCl_4$ to the photoelectrodes seems to increase electrode durability and dye (N719 dye) adsorption.
Figure 3:
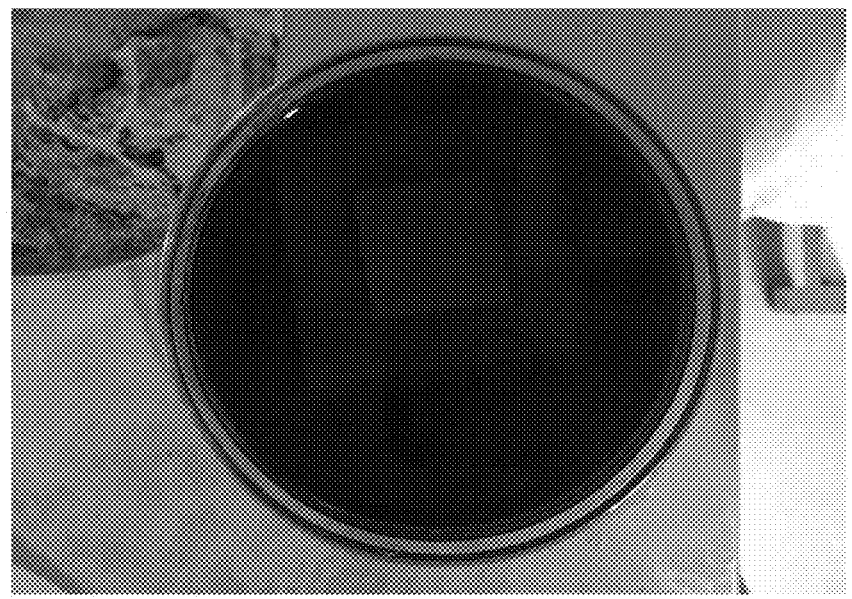
FIG. 3. Picture showing N-719 dye adsorption onto an immersed $WO_3$-based photoelectrode in a Petri dish.

FIG. 2 shows the fabricated $WO_3$-based photoelectrodes with and without $TiCl_4$ treatment. $TiCl_4$ treatment was utilized to increase electrode durability and dye (N719 dye) adsorption. FIG. 3 shows an immersed $WO_3$-based photoelectrode in a Petri dish for adsorption of N-719 dye.

Figure 4:
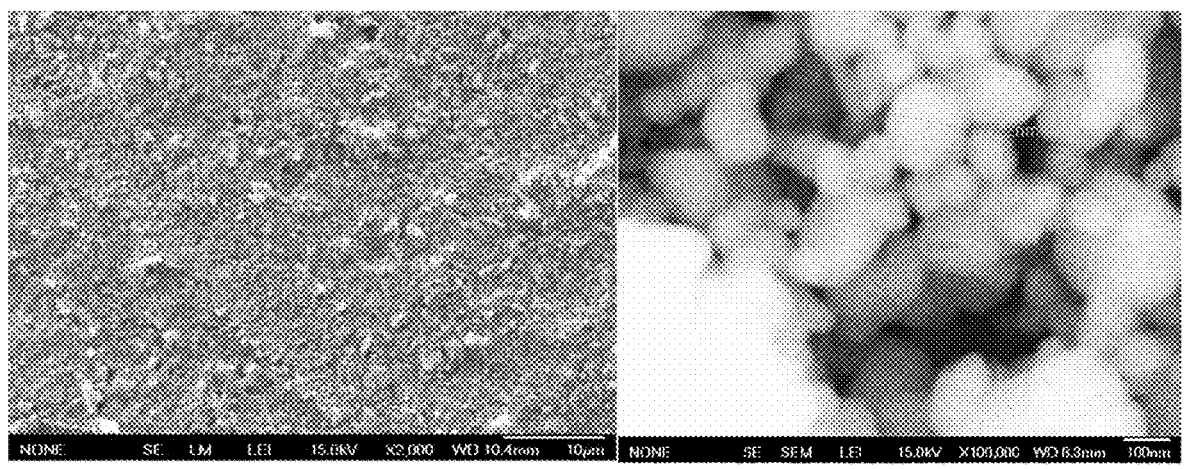
FIG. 4. SEM Images of a typical $WO_3$-based photoanode at different resolutions.

FIG. 4 shows SEM images of the $WO_3$-based photoanode at different resolutions. FIG. 4A (left) was at ×2,000 while FIG. 4B (right) was at ×100,000.

The results indicated that the photoelectrode was composed of nano-sized $WO_3$ particles that are fused together by the $TiCl_4$ treatment and high-temperature sintering. The prepared photoelectrode provides a high surface area that allows for a high dye loading.

The redox couple in the ADSC system is important because not only it helps to regenerate the oxidized dye (e.g., N-719), but also determines the photovoltage of the system. Ferrocene (Fc) and its corresponding oxidized species ($Fc^+$) were tested. For example, according to the following reaction: $Fe(C_5H_5)_2 \leftrightarrow Fe(C_5H_5)_2^+ + e^-$, the redox couple sets the electrochemical potential at around 1.2V (vs. NHE) at the counter electrode.

Figure 5:
FIG. 5. Exemplary all-day solar cell under testing using 0.1 M Ferrocene with 0.05 M $TBAF_6$ in acetonitrile (FIG. 1A, left) and 0.01M vanadium ($V^{4+}$) in 3 M $H_2SO_4$ (FIG. 1B, right). The simulated light illumination (from a solar simulator) and electric cable connections are shown.
Figure 5:
Figure 6:
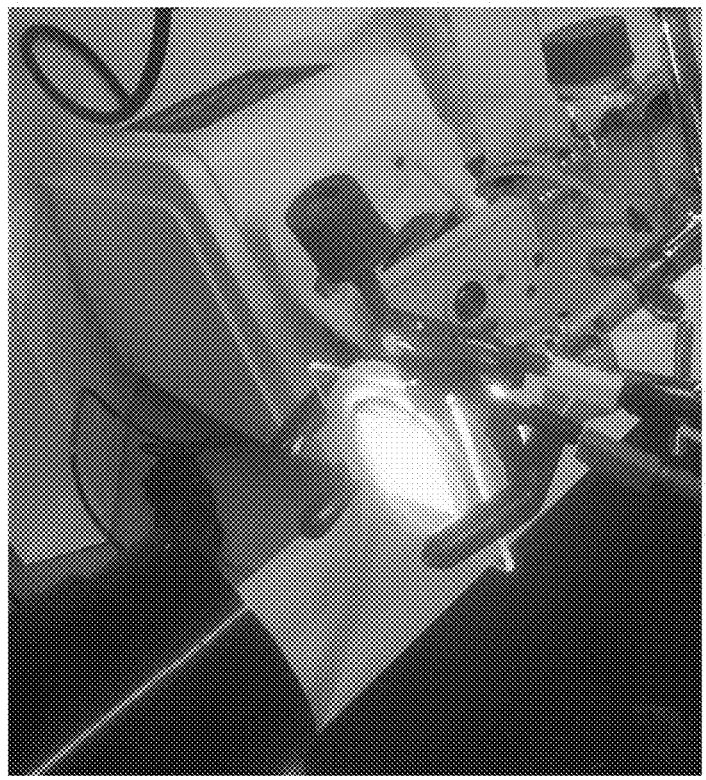
FIG. 6. Exemplary compact all-day solar cell under testing using vanadium ($V^{4+}$) electrolytes.

FIG. 5 shows an embodiment of an ADSC under testing using 0.1 M Ferrocene with 0.05 M $TBAF_6$ in acetonitrile (FIG. 5A, left) and 0.01M vanadium ($V^{4+}$) in 3 M $H_2SO_4$ (FIG. 5B, right). The simulated light illumination (from a solar simulator) and electric cable connections are shown. FIG. 6 shows an embodiment of an ADSC under testing using vanadium ($TiCl_4$) electrolytes. This design was much thinner than that shown in FIG. 5.

Figure 7:
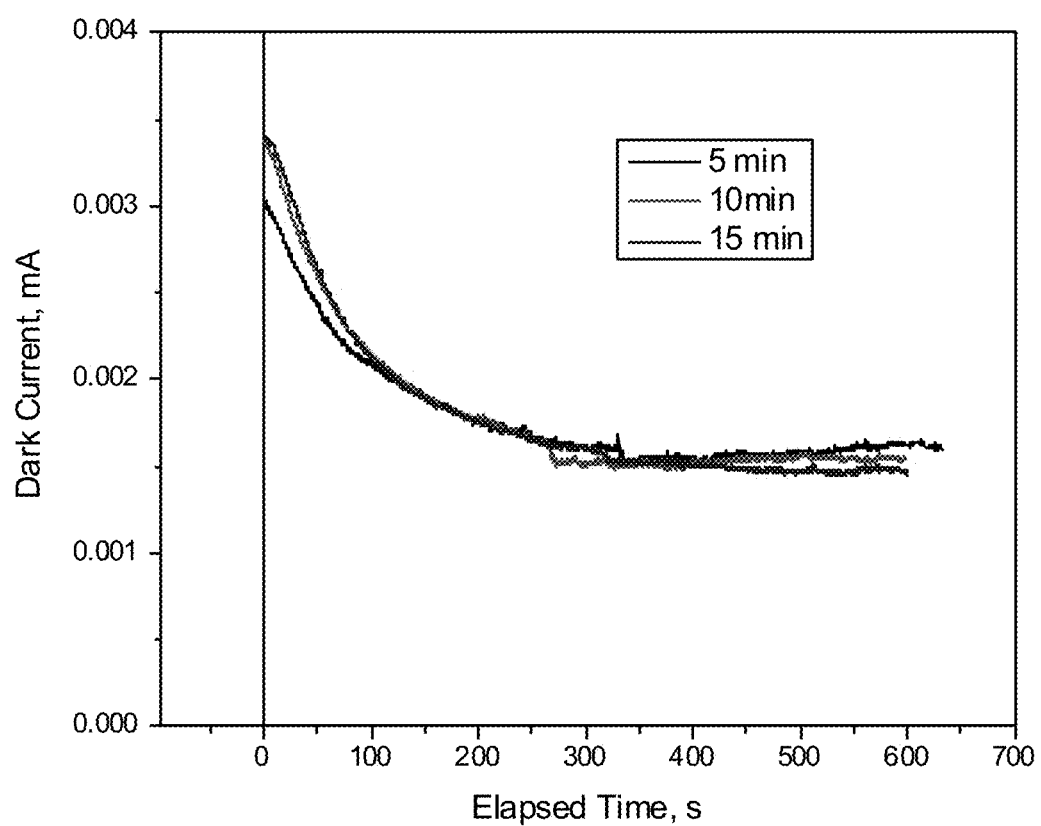
FIG. 7. Dark currents after illumination for 5 min, 10 min, and 15 min under open-circuit condition. The WO3-based photoanode was in contact with 0.1M ferrocene (Fc) in Acetonitrile. 0.01 M $TBAPF_6$ was used as the supporting electrolyte.

FIG. 7 shows dark currents after illumination for 5 min, 10 min, and 15 min under open-circuit condition. The $WO_3$-based photoanode was in contact with 0.1 M ferrocene in acetonitrile. 0.01 M $TBAPF_6$ was used as the supporting electrolyte.

Figure 8:
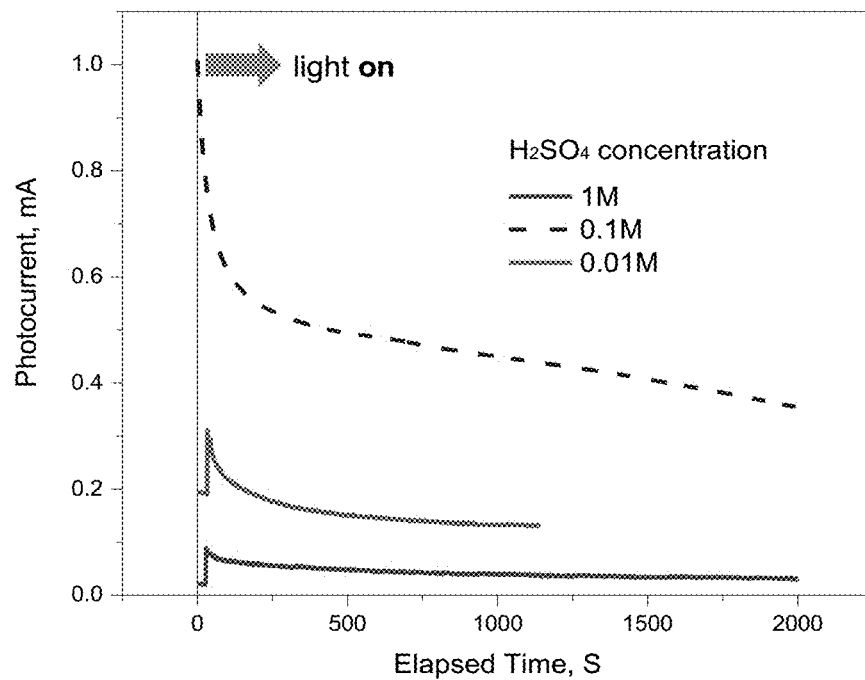
FIG. 8.
Figure 8:
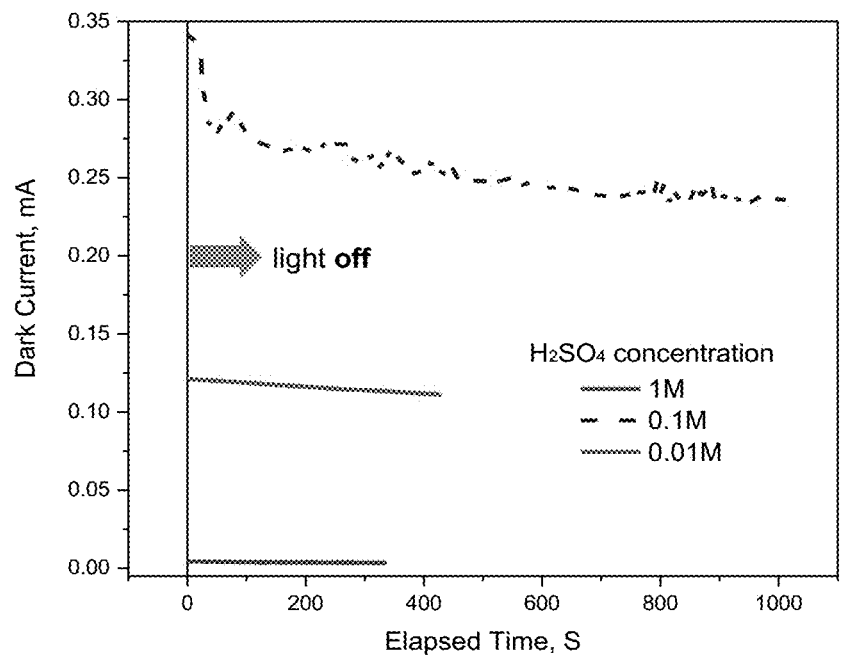
Figure 9:
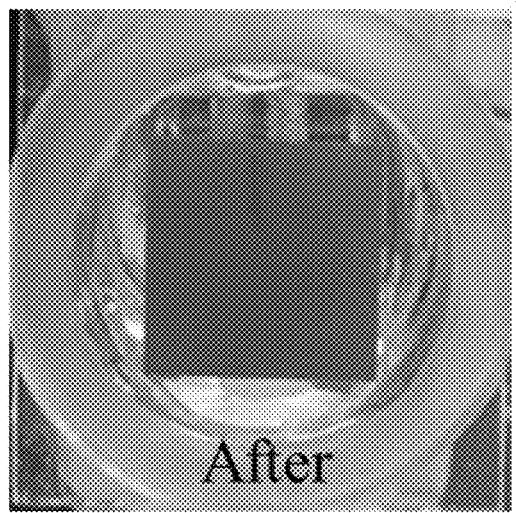
FIG. 9. Image of the $WO_3$-based photoanode after testing. The blue-black colored appearance of the electrode is due to the formed hydrogen tungsten bronze because of electron storage due to the following reaction under light: $WO_3 + H^+ + e^- \rightarrow H_xWO_3$.

Vanadium redox couples were tested in the ADSC. 0.01 M $V^{4+}$ balanced with different $H_2SO_4$ concentrations was studied. The redox couple has the electrochemical potential at around 1.0 V (vs. NHE), yielding an open circuit potential of ~1.1 V. FIG. 8 depicts the short-circuit currents under both illumination and dark. In addition, high photocurrents were found to yield high dark currents. This was because more photo-generated charges are created due to facilitated photoelectrochemical reactions, which contribute to both the photocurrent and electron storage under illumination. The stored charges were released under dark forming the dark-condition discharge current (bottom, FIG. 8B). The mechanism can be explained through the reversible intercalation/deintercalation of electrons and $H^+$ ions into/out of $WO_3$ to form hydrogen tungsten bronze, $H_xWO_3$. It was observed from the appearance of the electrode after the photoelectrochemical experiment (FIG. 9). The blue-black colored hydrogen tungsten bronze (confirmed by X-ray diffraction) appears on the electrode after AM1.5 irradiation due to the following reaction under light: $WO_3 + H^+ + e^- \rightarrow H_xWO_3$.

Figure 10:
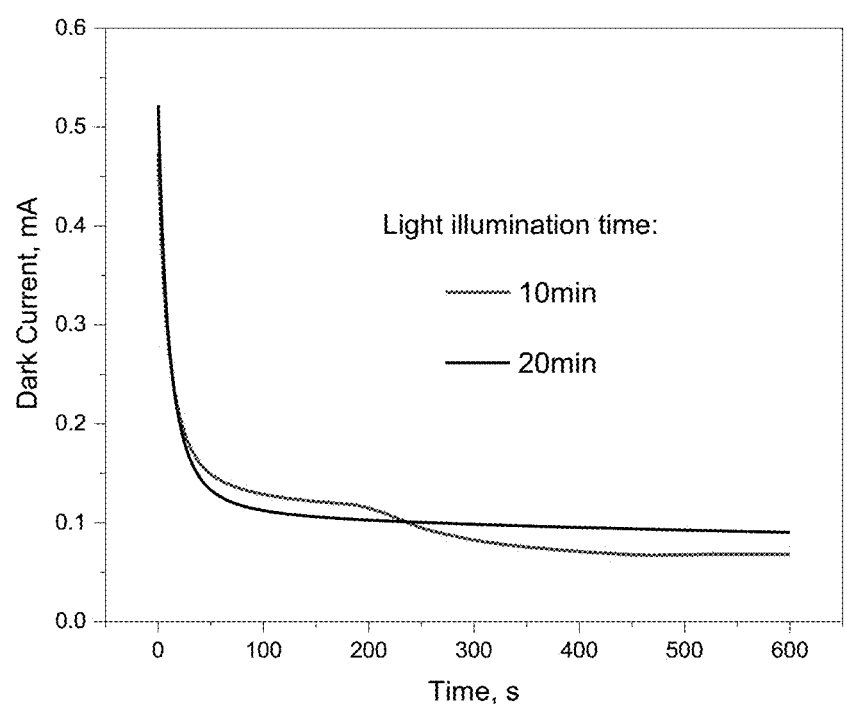
FIG. 10. Variation of short-circuit discharge current under dark for the ADSCs using 0.01M vanadium redox couple ($V^{4+}$) after under illumination for 5, 10, 15, and 20 min. The photoelectrode was N-719 sensitized $WO_3$ with $TiCl_4$ treatment. The electrolyte was 0.01 M vanadium ($V^{4+}$) balanced with 0.1M $H_2SO_4$.

The impact of light illumination period was also studied. As shown in FIG. 10, the $WO_3$ photoelectrode was tested under different light illumination periods including 10 and 20 min. A two-stage discharge profile was observed in FIG. 10, where the dark currents first dropped promptly and then appeared to reach saturation/stabilization eventually. Integrated area under the discharge curves in FIG. 10 was found to be irrelevant to the light illumination time, indicating that the photocharging process (i.e., forming the $H_xWO_3$) was fast and is nearly completed even with 5-min light illumination.

Figure 11:
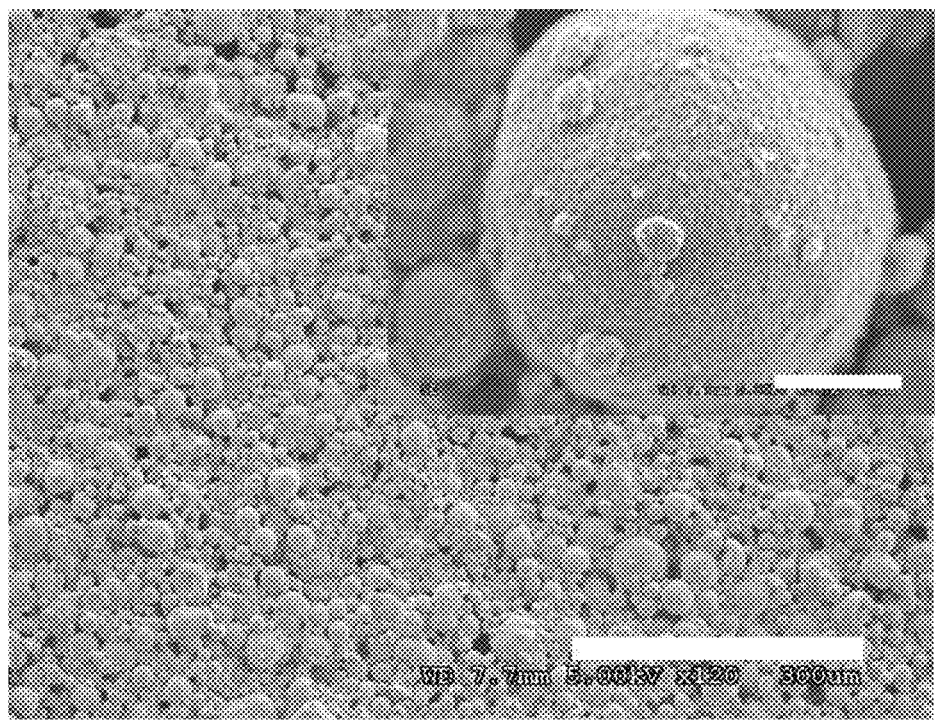
FIG. 11.
Figure 11:
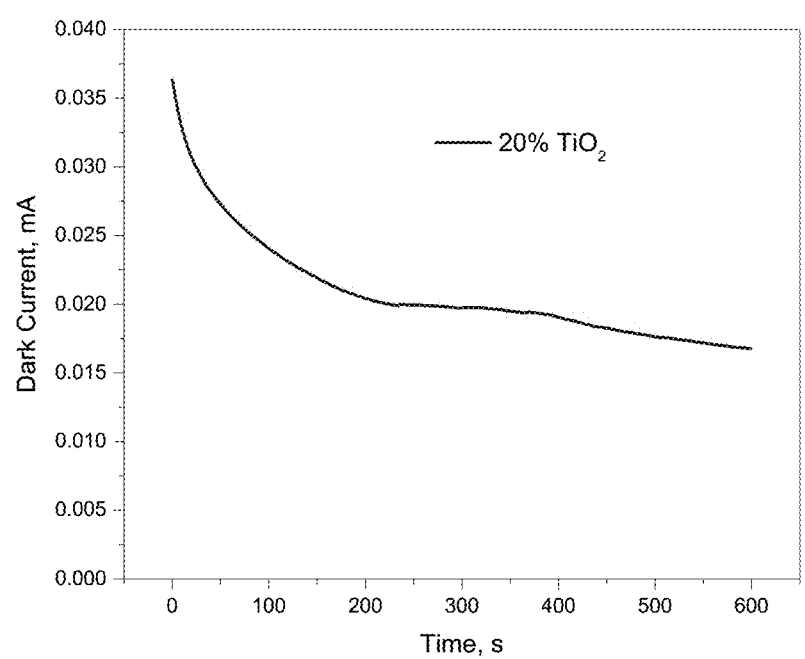

To increase durability of the ADSC, a $TiO_2$—$WO_3$ hybrid electrode was fabricated, as shown in FIG. 11. Results showed that (i) $TiO_2$ does not contribute to electron storage and (ii) it may render as the barricade to prevent electron transfer.

Figure 12:
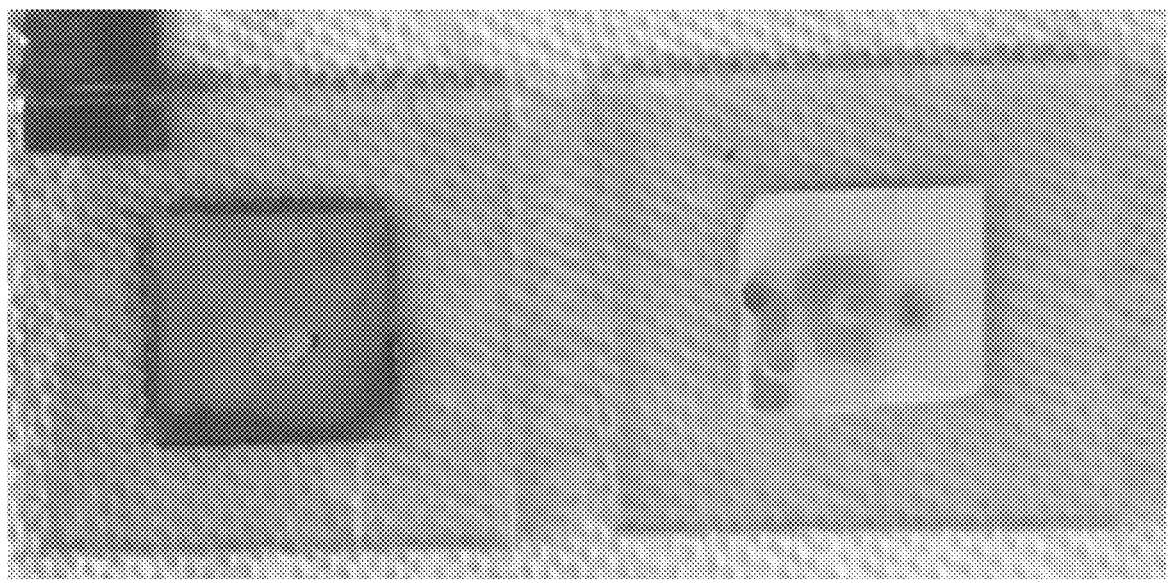
FIG. 12. Pictures showing the impact of Nafoin coating to prevent dye (N-719) loss from the photoelectrode. The electrode on the left (#8) was coated with Nafion while the one on the right (#7) was without the coating.

Additionally, coatings of the dye-sensitized photoelectrode were tested, for example fluoropolymers such as Nafion (sulfonated tetrafluoroethylene based fluoropolymer-copolymer), were shown to prevent dye loss from the photoelectrode (FIG. 12).

Applicant's disclosure is described herein in preferred embodiments with reference to the Figures, in which like numbers represent the same or similar elements. Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

The described features, structures, or characteristics of Applicant's disclosure may be combined in any suitable manner in one or more embodiments. In the description, herein, numerous specific details are recited to provide a thorough understanding of embodiments of the invention. One skilled in the relevant art will recognize, however, that Applicant's composition and/or method may be practiced without one or more of the specific details, or with other methods, components, materials, and so forth. In other instances, well-known structures, materials, or operations are not shown or described in detail to avoid obscuring aspects of the disclosure.

In this specification and the appended claims, the singular forms "a," "an," and "the" include plural reference, unless the context clearly dictates otherwise.

Unless defined otherwise, all technical and scientific terms used herein have the same meaning as commonly understood by one of ordinary skill in the art. Although any methods and materials similar or equivalent to those described herein can also be used in the practice or testing of the present disclosure, the preferred methods and materials are now described. Methods recited herein may be carried out in any order that is logically possible, in addition to a particular order disclosed.

INCORPORATION BY REFERENCE

References and citations to other documents, such as patents, patent applications, patent publications, journals, books, papers, web contents, have been made in this disclosure. All such documents are hereby incorporated herein by reference in their entirety for all purposes. Any material, or portion thereof, that is said to be incorporated by reference herein, but which conflicts with existing definitions, statements, or other disclosure material explicitly set forth herein is only incorporated to the extent that no conflict arises between that incorporated material and the present disclosure material. In the event of a conflict, the conflict is to be resolved in favor of the present disclosure as the preferred disclosure.

EQUIVALENTS

The representative examples are intended to help illustrate the invention, and are not intended to, nor should they be construed to, limit the scope of the invention. Indeed, various modifications of the invention and many further embodiments thereof, in addition to those shown and described herein, will become apparent to those skilled in the art from the full contents of this document, including the examples and the references to the scientific and patent literature included herein. The examples contain important additional information, exemplification and guidance that can be adapted to the practice of this invention in its various embodiments and equivalents thereof.

What is claimed is:

1. A solar cell system, consisting essentially of:
   a dye-sensitized photochromic semiconductor (SC) adapted to serve as a photoelectrode (PE) and a negative electrode (−);
   a layer of a fluoropolymer partially or completed coating the dye-sensitized photochromic semiconductor;
   a positive electrode (+); and
   an aqueous environment comprising a dissolved redox shuttle pair Ox/Re, selected from the group consisting of Vanadium, benzoquinone and anthraquinone, wherein the dye-sensitized photochromic semiconductor comprises:
   a Ruthenium dye having a light absorption band in the range from about 380 nm to about 750 nm, and
   $WO_3$ treated with $TiCl_4$.

2. The solar cell system of claim 1, wherein the dye is N-719 dye having the structural formula of

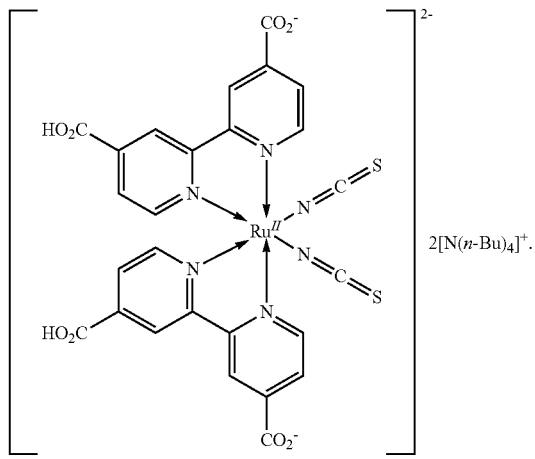

3. The solar cell system of claim 1, wherein the photochromic semiconductor comprises $TiO_2$—$WO_3$ hybrid electrodes.

4. The solar cell system of claim 1, wherein the photochromic semiconductor comprises nanoparticles of $WO_3$ fused together by the $TiCl_4$ treatment and a high-temperature sintering process.

5. The solar cell system of claim 4, wherein the redox couple is Vanadium in a supporting electrolyte comprising $H_2SO_4$.

6. The solar cell system of claim 5, wherein the fluoropolymer comprises Nafion (sulfonated tetrafluoroethylene based fluoropolymer-copolymer).

* * * * *